United States Patent
Lanois

(10) Patent No.: US 6,903,413 B2
(45) Date of Patent: Jun. 7, 2005

(54) SINGLE-POLE COMPONENT MANUFACTURING

(75) Inventor: Frédéric Lanois, Tours (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/168,040

(22) PCT Filed: Dec. 21, 2000

(86) PCT No.: PCT/FR00/03655

§ 371 (c)(1),
(2), (4) Date: Sep. 16, 2002

(87) PCT Pub. No.: WO01/47028

PCT Pub. Date: Jun. 28, 2001

(65) Prior Publication Data

US 2003/0057442 A1 Mar. 27, 2003

(30) Foreign Application Priority Data

Dec. 22, 1999 (FR) .............................. 99 16291

(51) Int. Cl.[7] .............................. H01L 29/76
(52) U.S. Cl. ................ 257/330; 257/200; 257/471; 257/484
(58) Field of Search ................ 257/200, 330, 257/471, 484

(56) References Cited

U.S. PATENT DOCUMENTS

| | | | |
|---|---|---|---|
| 4,134,123 A | * | 1/1979 | Shannon ................ 257/484 |
| 5,306,943 A | | 4/1994 | Ariyoshi et al. |
| 5,430,323 A | * | 7/1995 | Yamazaki et al. ........ 257/471 |
| 5,895,951 A | * | 4/1999 | So et al. ................ 257/330 |
| 6,091,108 A | | 7/2000 | Harris et al. |
| 6,586,800 B2 | * | 7/2003 | Brown ................ 257/330 |

FOREIGN PATENT DOCUMENTS

| | | |
|---|---|---|
| DE | 196 31 872 A1 | 2/1998 |
| DE | 198 15 907 C1 | 5/1999 |

OTHER PUBLICATIONS

English Translation Of The International Preliminary Examination Report from the corresponding PCT application No. PCT/FR00/03655.

International Search Report from patent application No. PCT/FR 00/03655, filed Dec. 21, 2000.

Patent Abstracts of Japan, vol. 007, No. 027 (E–156), Feb. 3, 1983 and Jp 57 181172 A (Tokyo Shibaura Denki KK), Nov. 8, 1982.

* cited by examiner

Primary Examiner—David Nelms
Assistant Examiner—Dao H. Nguyen
(74) Attorney, Agent, or Firm—Lisa K. Jorgenson; James H. Morris; Wolf, Greenfield & Sacks, P.C.

(57) ABSTRACT

The invention relates to a vertical-type single-pole component, comprising regions (34) with a first type of conductivity (P) which are embedded in a thick layer (32) with a second type of conductivity (N). Said regions are distributed over at least one same horizontal level and are independent of each other. The regions also underlie an insulating material (70).

14 Claims, 3 Drawing Sheets

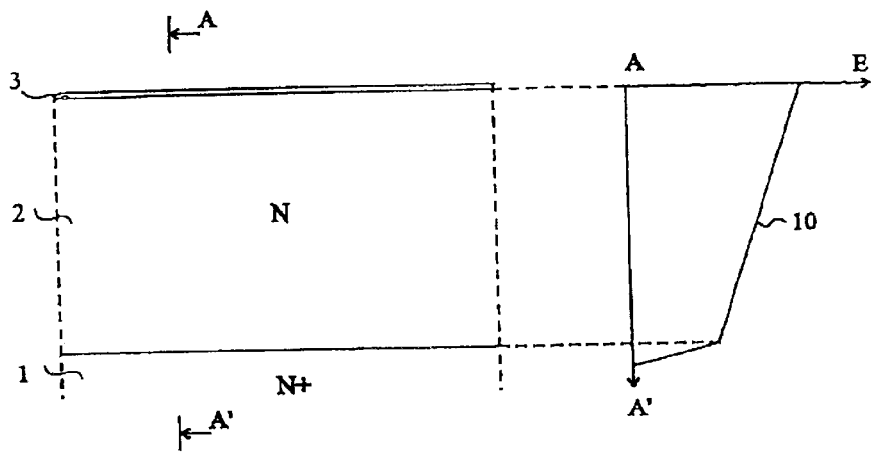
Fig 1
Prior Art
Fig 2
Prior Art
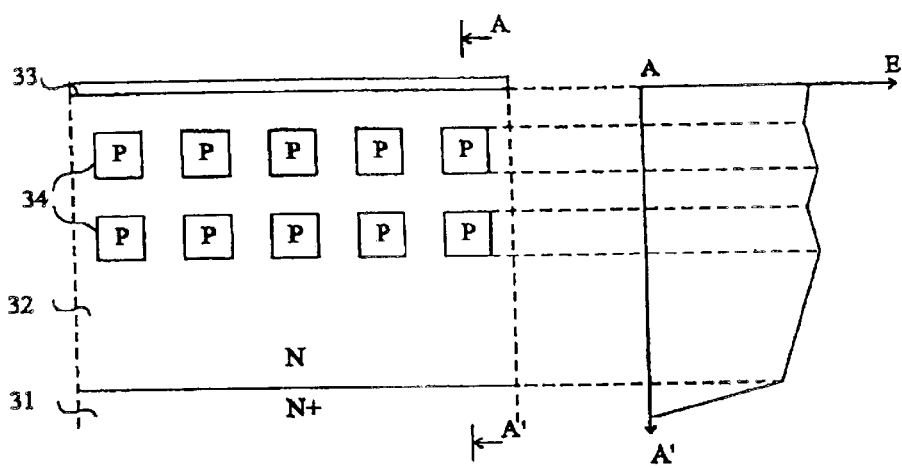
Fig 3
Prior Art
Fig 4
Prior Art

SINGLE-POLE COMPONENT MANUFACTURING

BACKGROUND OF THE INVENTION

1. Field of the Invention

The present invention relates to the manufacturing of single-pole components in vertical monolithic form. The following description more specifically relates to components of Schottky diode type made in vertical form in silicon substrates.

2. Discussion of the Related Art

FIG. 1 illustrates a conventional Schottky diode structure. Such a structure includes a semiconductor substrate 1, typically made of heavily-doped single-crystal silicon of a first conductivity type, generally N type. A cathode layer 2 covers substrate 1. It is N-type doped, but more lightly than substrate 1. A metal layer 3 forms a Schottky contact with N-type cathode 2.

The thickness of layer 2 is chosen to determine the reverse breakdown voltage of the Schottky diode.

FIG. 2 illustrates the variation of the electric field E across the thickness of the structure shown in FIG. 1, along an axis A–A'. For clarity, the different portions of curve 10 of FIG. 2 have been connected by dotted lines to the corresponding regions of FIG. 1.

In such a homogeneous structure, the field variation per thickness unit is proportional to the doping level. In other words, the field decreases all the faster as the doping is heavy. It thus very rapidly drops to a zero value in substrate 1. Since the breakdown voltage corresponds to the surface included between the axes and curve 10, to obtain a high breakdown voltage, the doping of layer 2 must be minimized and its thickness must be maximized.

In the manufacturing of single-pole components, opposite constraints have to be considered. Single-pole components, such as the diode shown in FIG. 1, must indeed have as small a resistance (Ron) as possible, while having as high a breakdown voltage as possible when reverse biased. Minimizing the on-state resistance of a single-pole component imposes minimizing the thickness of the most lightly doped layer (layer 2) and maximizing the doping of this layer.

To optimize the breakdown voltage without modifying resistance Ron, structures of the type of that in FIG. 3 have been provided. In FIG. 3, a vertical Schottky diode includes a single-crystal silicon semiconductor substrate 31, heavily doped of a first conductivity type, for example, type N, and coated with a layer 32. Layer 32 is formed of the same semiconductor material as substrate 31 and is of same doping type, but more lightly doped. Layer 32 is intended for forming the cathode of the Schottky diode. A metal layer 33 covers layer 32. The metal forming layer 33 is chosen to form a Schottky contact with N-type silicon 32.

Layer 32 includes very heavily-doped P-type silicon regions or "islands" 34. Islands 34 are distributed over at least one horizontal level (over two levels in the example of FIG. 3).

Islands 34 are separate and buried in layer 32. The islands 34 of different horizontal levels are substantially distributed on same vertical lines.

FIG. 4 illustrates the variation profile of electric field E across the thickness of a structure similar to that in FIG. 3. More specifically, the profile of FIG. 4 is observed along axis A–A' of FIG. 3.

As appears from the comparison of FIGS. 2 and 4, the insertion of heavily-doped P-type "islands" 34 in the structure of FIG. 3 modifies the variation of field E per thickness unit. Since islands 34 are much more heavily doped than N-type layer 32, there are more negative charges created in islands 34 than there are positive charges in layer 2. The field thus increases back in each of the horizontal areas including islands 34. By setting the doping and the number of islands 34, the space charge area can be almost indefinitely widened. In reverse biasing, the cathode formed by layer 32 and islands 34 thus generally behaves as a quasi-intrinsic layer. In average, the electric field variation per thickness unit thus strongly decreases. Thus, for a given doping level of layer 32, the breakdown voltage is increased, as illustrated by the increase of the surface delimited by the axes and the curve of FIG. 4 as compared to the corresponding surface of FIG. 2.

Accordingly, the structure of FIG. 3 enables obtaining single-pole components of given breakdown voltage with a resistance Ron smaller than that of a conventional structure.

The practical implementation of such a structure with islands is described, for example, in German patent 19,815,907 issued on May 27, 1999, in patent applications DE 19,631,872 and WO99/26,296, and in French patent 2,361,750 issued on Mar. 10, 1978. These different documents provide obtaining a structure similar to that in FIG. 3 by performing implantations/diffusions during a growth epitaxy of layer 32.

The repeated interruptions of the epitaxial growth are a disadvantage of such an implementation. Indeed, thick layer 32 thus obtained has an irregular structure. Such structure irregularities alter the performances of the final component.

SUMMARY OF THE INVENTION

An object of the present invention is to provide a novel method for manufacturing single-pole components of vertical type having a determined breakdown voltage and having a reduced on-state resistance. The present invention also aims at the obtained components.

To achieve these objects, the present invention provides a single-pole component of vertical type, including regions of a first conductivity type buried in a thick layer of a second conductivity type, said regions being distributed over at least one same horizontal level and being independent from one another, and the independent regions of which underlie an insulating material.

According to an embodiment of the present invention, the component includes at least two levels, the independent regions of successive levels being substantially vertically aligned.

According to an embodiment of the present invention, the independent regions are rings.

According to an embodiment of the present invention, the deepest level includes non ring-shaped regions.

The present invention also provides a method for manufacturing a single-pole component of vertical type in a silicon substrate of a given conductivity type, including the steps of:

a) forming openings in a thick silicon layer covering the substrate, doped of the same conductivity type as said substrate, but more lightly;

b) coating the walls and bottoms of the openings with a silicon oxide layer;

c) forming, by implantation/diffusion through the opening bottoms, regions of the conductivity type opposite to that of the substrate; and d) filing the openings with an insulating material.

According to an embodiment of the present invention, before step d) of filling the openings, steps a) to c) are repeated at least once, the initial openings being continued into the thick silicon layer.

According to an embodiment of the present invention, the silicon layer of the same given type of conductivity as the substrate is intended for forming the cathode of a Schottky diode.

According to an embodiment of the present invention, the silicon layer of same conductivity type as the substrate is intended for forming the drain of a MOS transistor.

The foregoing and other objects, features and advantages of the present invention, will be discussed in detail in the following non-limiting description of specific embodiments in connection with the accompanying drawings, in which:

BRIEF DESCRIPTION OF THE DRAWINGS

FIG. 1 illustrates, in a partial simplified cross-section view, a conventional Schottky diode structure;

FIG. 2 illustrates the variation of the electric field across the thickness of the structure of FIG. 1;

FIG. 3 illustrates, in a partial simplified cross-section view, the structure of a Schottky diode having a determined breakdown voltage and a reduced on-state resistance;

FIG. 4 illustrates the variation of the electric field across the thickness of the structure of FIG. 3.

For clarity, the same elements have been designated with the same references in the different drawings. Further, as usual in the representation of integrated circuits, the drawings are not to scale.

FIGS. 5A to 5D illustrate steps of a manufacturing method of a vertical monolithic Schottky diode according to the present invention.

DETAILED DESCRIPTION OF THE INVENTION

Figure 5A:
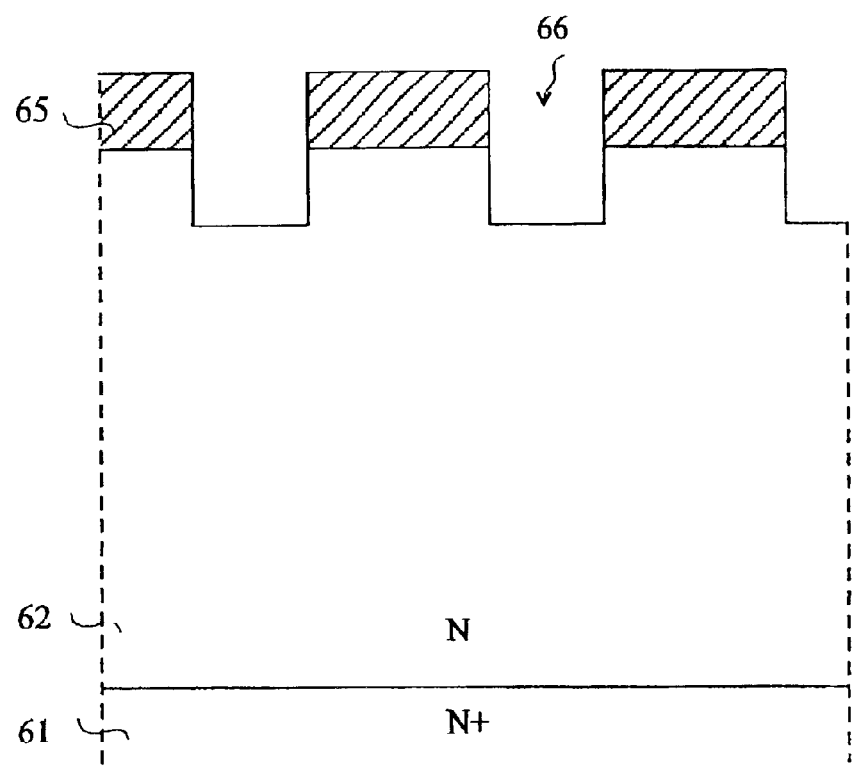
FIGS. 5A to 5D are partial simplified cross-section views of a Schottky diode at different steps of a manufacturing process according to the present invention.

As illustrated in FIG. 5A, a substrate 61 is initially covered with a single-crystal silicon layer 62, of same doping type, for example N, as substrate 61. Layer 62, intended for forming the cathode of the Schottky diode, is more lightly doped than substrate 61. Layer 62 is etched, by means of a mask 65, to form openings 66. Substrate 61 and layer 62 are obtained by any appropriate method. For example, layer 62 may result from an epitaxial growth on substrate 61, or substrate 61 and layer 62 may initially be a same semiconductor region, the doping differences then resulting from implantation-diffusion operations.

Figure 5B:
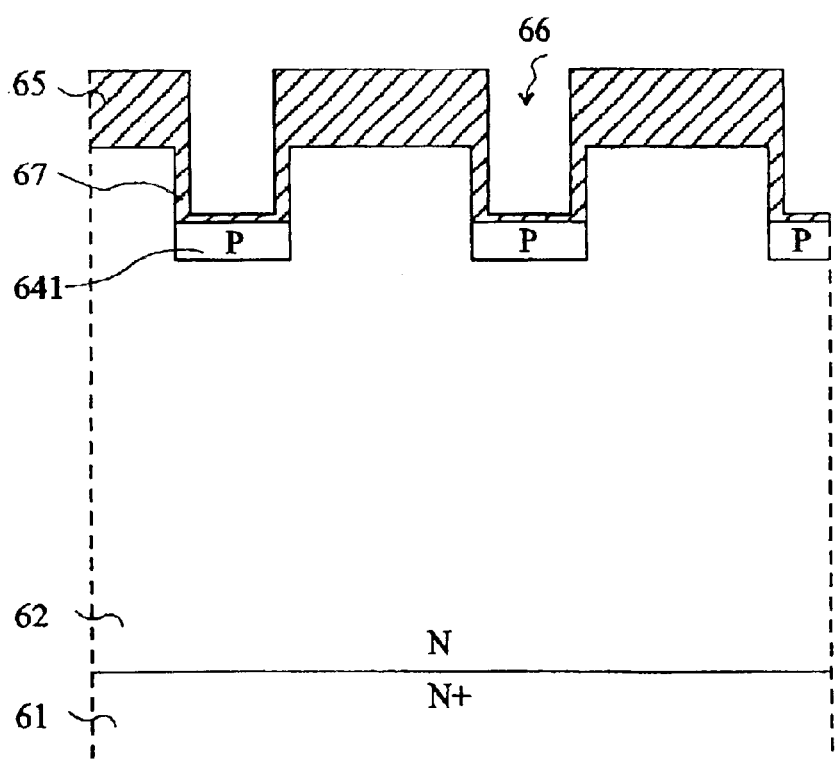

At the next steps, illustrated in FIG. 5B, an insulating layer 67, for example a silicon oxide layer ($SiO_2$), is formed on the walls and at the bottom of openings 66. Then, a P-type dopant that penetrates into the silicon at the bottom of openings 66 is implanted, after which a heating is performed to form heavily-doped P-type regions 641.

Figure 5C:
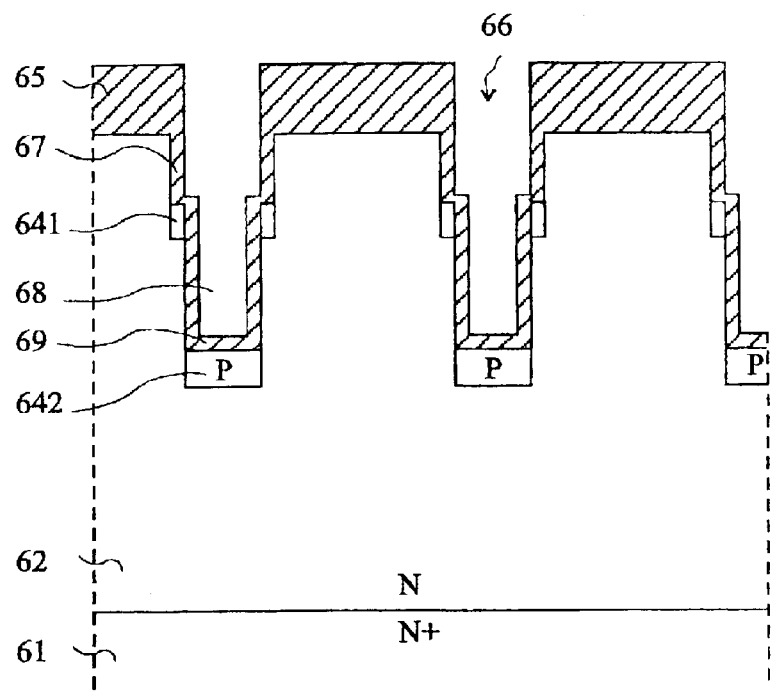

At the next steps, illustrated in FIG. 5C, layer 67, regions 641, and layer 62 are anisotropically etched, to form openings 68 that continue openings 66. The upper portion of each of openings 68 is thus surrounded with a diffused ring 641. Then, the walls and bottoms of openings 68 are covered with a thin insulating layer 69, for example silicon oxide.

The implantation operations previously described in relation with FIG. 5B are then repeated to form heavily-doped P-type regions 642.

Figure 5D:
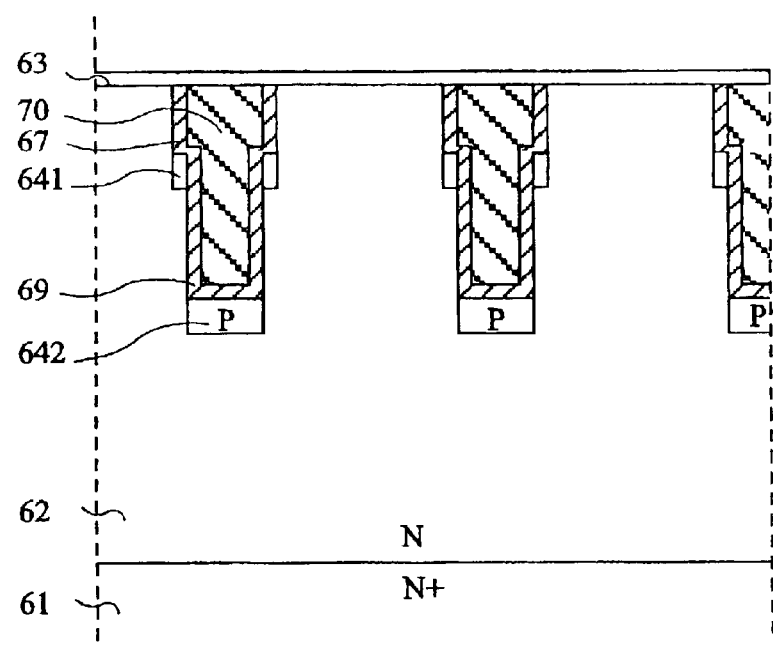

At the next steps, illustrated in FIG. 5D, openings 66–68 are filled with an insulating material 70. Then, mask 65 is removed and the structure thus obtained is planarized. Finally, a metal layer 63 adapted to ensuring a Schottky contact with layer 62 is deposited over the entire structure.

Before ending, in accordance with the steps described in relation with FIG. 5D, the structure formation by removing mask 65, filling openings 66 with material 70, and depositing a metal layer 63, the steps described in relation with FIG. 5C could be repeated several times, to form several horizontal levels of heavily-doped P-type rings similar to rings 641.

It should be noted that the intermediary rings and the underlying regions form islands according to the preceding definition. They thus provide the corresponding advantages, previously discussed in relation with FIGS. 3 and 4.

An advantage of the method according to the present invention and of the resulting structure, previously described in relation with FIG. 5D, is the forming of a homogeneous cathode region 62.

Those skilled in the art will know how to adapt the number, the dimensions, the positions, and the doping of the different rings 641, 642 to the desired performances. As an example, according to prior art, to obtain a breakdown voltage of approximately 600 volts, a cathode layer (2, FIG. 1) of a thickness of approximately 40 $\mu$m and of a doping level on the order of $2.2 \cdot 10^{14}$ atoms/cm$^3$ may be used, which results in an on-state resistance of approximately 6.7 $\Omega \cdot \text{mm}^2$. According to the present invention, by using groups of three P-type rings doped at approximately $3.5 \cdot 10^{17}$ atoms/cm$^3$, vertically spaced apart by 10 $\mu$m around silicon oxide columns of a 1-$\mu$m width, for a same breakdown voltage of 600 V with an epitaxied layer (62, FIG. 5D) of a same thickness on the order of 40 $\mu$m, the cathode doping could be increased to a value on the order of some $10^{15}$ atoms/cm$^3$, which results in an on-state resistance of approximately 3 $\Omega \cdot \text{mm}^2$.

It should be noted that it has been chosen to describe as a non-limiting example the present invention in relation with FIG. 6 applied to the forming of silicon islands in the cathode of a Schottky diode. It would however be possible to implement a method aiming at forming in the drain of a MOS transistor, around vertical columns of an insulating material, very heavily-doped P-type silicon rings, similarly to the method previously described in relation with FIGS. 5A–D.

Of course, the present invention is likely to have various alterations, modifications, and improvements which will readily occur to those skilled in the art. In particular, the operations described in relation with FIG. 5D can be carried out according to any appropriate sequence. Thus, after filling openings 66–68, layer 65 may be removed and the structure may be planarized in a single step by means of a chem-mech polishing (CMP) method.

Further, the present invention applies to the forming in vertical form of any type of single-pole component, be it to reduce its on-state resistance for a given breakdown voltage, or to improve its breakdown voltage without increasing its on-state resistance.

What is claimed is:

1. A single-pole component of vertical type, including regions of a first conductivity type buried in a thick layer of a second conductivity type, the regions being distributed over at least one same horizontal level and being independent from one another, wherein the regions are buried within the thick layer of the second conductivity type and disposed under, at a side of, or around columns filled with an insulating material, wherein the columns extend into the thick layer from an upper surface thereof.

2. The component of claim 1, wherein the single-pole component includes at least two levels, the regions of successive levels being substantially vertically aligned.

3. The component of claim 2, wherein the regions of one of the at least two levels are rings.

4. The component of claim 3, wherein a deepest level of the at least two levels includes non ring-shaped regions.

5. A single pole component comprising:

a substrate of a first conductivity type;

a layer of the first conductivity type on the substrate, the layer being more lightly doped than the substrate;

columns of insulating material extending into the layer from an upper surface thereof; and buried regions of a second conductivity type distributed over at least one horizontal level of the layer adjacent to the columns of insulating material.

6. A single pole component as defined in claim 5, wherein the buried regions comprise rings around the columns.

7. A single pole component as defined in claim 5, wherein the buried regions are located adjacent to bottoms of the columns.

8. A single pole component as defined in claim 5, wherein the buried regions are distributed over first and second horizontal levels of the layer.

9. A single pole component as defined in claim 8, wherein the buried regions of the first horizontal level comprise rings around the columns and wherein the buried regions of the second horizontal level comprise regions at bottoms of the columns.

10. A single pole component as defined in claim 5, wherein the buried regions are heavily doped.

11. A single pole component as defined in claim 5, wherein the substrate and the layer are N type and the buried regions are P type.

12. A single pole component as defined in claim 11, wherein the substrate and the layer are silicon.

13. A single pole component as defined in claim 5, comprising a Schottky diode.

14. A single pole component as defined in claim 5, comprising an MOS transistor.

* * * * *